(12) United States Patent
Wu et al.

(10) Patent No.: US 6,489,573 B2
(45) Date of Patent: Dec. 3, 2002

(54) ELECTRODE BONDING STRUCTURE FOR REDUCING THE THERMAL EXPANSION OF THE FLEXIBLE PRINTED CIRCUIT BOARD DURING THE BONDING PROCESS

(75) Inventors: Jiun-Han Wu, Sanchung (TW); Tzeng-Shii Tsai, Hsinchu (TW); Po-Cheng Chen, Yunghe (TW)

(73) Assignee: Acer Display Technology, Hsinchu (TW)

( * ) Notice: Subject to any disclaimer, the term of this patent is extended or adjusted under 35 U.S.C. 154(b) by 0 days.

(21) Appl. No.: 09/877,252

(22) Filed: Jun. 11, 2001

(65) Prior Publication Data

US 2002/0033532 A1 Mar. 21, 2002

(30) Foreign Application Priority Data

Jun. 16, 2000 (TW) ......................... 89111796 A

(51) Int. Cl.⁷ .............................. H05K 1/02
(52) U.S. Cl. .................. 174/259; 174/261; 174/262
(58) Field of Search ................ 174/261, 259, 174/262, 263; 438/620, 427; 361/795

(56) References Cited

U.S. PATENT DOCUMENTS 5,404,265 A * 4/1995 Moresco et al. ......... 361/306.1
5,943,598 A * 8/1999 Lin ........................... 438/620
6,146,995 A * 11/2000 Ho ........................... 438/637

FOREIGN PATENT DOCUMENTS

TW 76212079 5/1989
TW 85114766 11/1996

* cited by examiner

Primary Examiner—Albert W. Paladini
(74) Attorney, Agent, or Firm—Rabin & Berdo, P.C.

(57) ABSTRACT

An electrode bonding structure is disclosed for reducing the thermal expansion of a circuit board during the bonding process of the circuit board and a substrate of a flat display. The electrode bonding structure includes a substrate, a circuit board, and an anisotropic conductive film ACF. A substrate dielectric layer and an indenting pad are formed on the surface of the substrate, and the inner surface of the indenting pad is lower than the surface of the substrate dielectric layer by an indenting depth H3. The circuit board is placed parallel to the substrate, and a circuit dielectric layer and a bump pad are formed on the surface of the circuit board. The bump pad is higher than the surface of the circuit dielectric layer by a height H1. The ACF is placed between the substrate and the circuit board, and the thickness of the ACF is a thickness H2. The position of the indenting pad is corresponded to that of the bump pad, and the height H1 is not less than the sum of the thickness H2 and the depth H3, that is, H1>=H2+H3. The thermal expansion of the circuit board can be reduced during the bonding process of the substrate and the circuit board and the quality of the display can also be improved.

7 Claims, 9 Drawing Sheets

ELECTRODE BONDING STRUCTURE FOR REDUCING THE THERMAL EXPANSION OF THE FLEXIBLE PRINTED CIRCUIT BOARD DURING THE BONDING PROCESS

This application incorporates by reference Taiwanese application Serial No. 089111796, filed Jun. 16, 2000.

BACKGROUND OF THE INVENTION

1. Field of the Invention

The invention relates to an electrode bonding structure for reducing the thermal expansion of the flexible printed circuit board during the bonding process, and more particularly to the electrode bonding structure used in the flat display substrate.

2. Description of the Related Art

A flat display substrate, such as a liquid crystal display (LCD) or a plasma display panel (PDP) substrate, uses several flexible printed circuit (FPC) boards to connect the outer driving circuit and the substrate. The control signals of the driving circuit are transmitted through the FPC board to the substrate. The substrate and the flexible printed circuit boards include a plurality of electrodes to transmit the control signals.

Referring to FIG 1A, 1B and 1C, FIG 1A shows the layout of electrodes in a conventional substrate; FIG 1B is a cross-sectional view along the Y direction of FIG 1A, and FIG 1C is a cross-sectional view along the X direction of FIG 1A. The conventional panel 100 has a glass substrate 102 and the electrodes, such as electrode 104 and 106. These electrodes are bar-shaped and spaced apart from each other on the glass substrate 102. The pitch between the electrodes is P, for example, P can be 300 $\mu$m. Besides, the electrodes are made of silver.

The silver electrodes of the conventional panel 100 in FIG 1A have a problem of silver ion migration. This problem becomes more severe as time goes by and eventually resulting in a short circuit. If the resolution of the flat display is increased, the pitch between the electrodes is reduced, then the influence of the ion migration becomes more remarkable.

Referring to FIG. 2, it illustrates the cross-sectional diagram of the substrate and the flexible printed circuit (FPC) board before bonded. The FPC board 200 includes a polyimide layer 202 and a number of electrodes 216. The arrangement of the electrodes 216 on the FPC board 200 is similar to that of the electrodes 218 on the glass substrate 102. Before the bonding process, the sum of all pitches between the electrodes 216 on the FPC board 200 is A $\mu$m, and the sum of all pitches between the electrodes 218 on the glass substrate 102 is B $\mu$m. Besides, an anisotropic conductive film (ACF, not illustrated) is formed between the FPC board 200 and the panel 100. The ACF further includes a lot of conductive particles for electrically connecting the electrodes 216 and 218 in the vertical direction.

The thermal expansion coefficients of the substrate 102 and the FPC 200 are different because the materials of the substrate 102 and the FPC 200 are different. After the bonding process, the sum of all pitches between the electrodes 216 on the FPC 200 will be changed to A' $\mu$m and all pitches between the electrodes 218 on the substrate 102 will be changed to B' $\mu$m. In order to bond the FPC and the substrate tightly, A' must be equal to B'. The relations between A, A', B, B' are listed below.

A'=A$\alpha$ $\alpha$ is the thermal expansion coefficient of the FPC board

B'=B$\gamma$ $\gamma$ is the thermal expansion coefficient of the glass substrate Since A' equals to B'

B=A $\alpha/\gamma$ $\alpha/\gamma$ is the coefficient of thermal expansion compensation The coefficient of thermal expansion compensation varies according to the materials of the glass substrate 102, the anisotropic conductive film (ACF), the polyimide layer 202, and the materials used for transmitting heat in the process. Since the materials used in the substrate 102 and the FPC board 200 will affect the coefficient of thermal expansion compensation, the design of the FPC board becomes more complicated. Further, in the manufacturing process, the coefficient of thermal compensation will be affected by environmental conditions (e.g. temperature, pressure), resulting in an inaccuracy in connecting all the electrodes 218 on the substrate 102 and all the electrodes 216 on the FPC board 200. Therefore, the quality of the products will be affected.

SUMMARY OF THE INVENTION

It is therefore an object of the invention to provide an electrode bonding structure that can reduce the thermal expansion of the FPC board during the bonding process of the FPC board and the display panel. Besides, the silver ion migration problem can be solved by:

1) enlarging the ends of the electrodes and changing the position of the electrodes; and 2) covering the electrodes with a dielectric layer.

The shape of the electrodes on the substrate of the display panel and the FPC board is changed to reduce errors occurring in the bonding process.

The invention provides an electrode bonding structure comprising a substrate, a circuit board, and an anisotropic conduct film ACF. A substrate dielectric layer and an indenting pad are formed on the surface of the substrate, and the indenting pad is lower than the surface of the substrate dielectric layer by a depth H3. The circuit board is placed parallel to the substrate, a circuit dielectric layer and a bump pad are formed on the surface of the circuit board. The bump pad is higher than the surface of the circuit dielectric layer by a height H1. The ACF is placed between the substrate and the circuit board, and has a thickness H2. The position of the indenting pad is corresponded to that of the bump pad. Further, the height H1 is greater than or equal to the sum of the thickness H2 and the depth H3 (H1>=H2+H3) so that the ACF above the bump pad is squeezed after the substrate and the circuit board are bonded for electrically connecting the substrate and the circuit board, and the bump pad is positioned into the indenting pad for reducing a thermal expansion of the circuit board caused during the process for bonding the substrate and the circuit board.

Another electrode bonding structure is also disclosed in the present invention. The electrode bonding structure comprises: a substrate, a circuit board, and an anisotropic conduct film (ACF). A substrate dielectric layer is formed on the substrate and a bump pad is further formed on the surface of the substrate dielectric layer. The top of the bump pad is higher than the surface of the substrate dielectric layer by a height H1. The circuit board is placed parallel to the substrate, a circuit dielectric layer and an indenting pad are formed on the circuit board. The inner surface of the indenting pad is lower than the circuit dielectric layer by a depth H3. The ACF, is placed between the substrate and the circuit board, and has a thickness H2. The height H1 is greater than or equal to the sum of the thickness H2 and the depth H3 (H1>=H2+H3) such that the ACF above the bump pad is squeezed after the substrate and the circuit board are bonded for electrically connecting the substrate and the circuit board, and the bump pad is positioned into the indenting pad for reducing a thermal expansion of the circuit board caused during the process for bonding the substrate and the circuit board.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 3A:
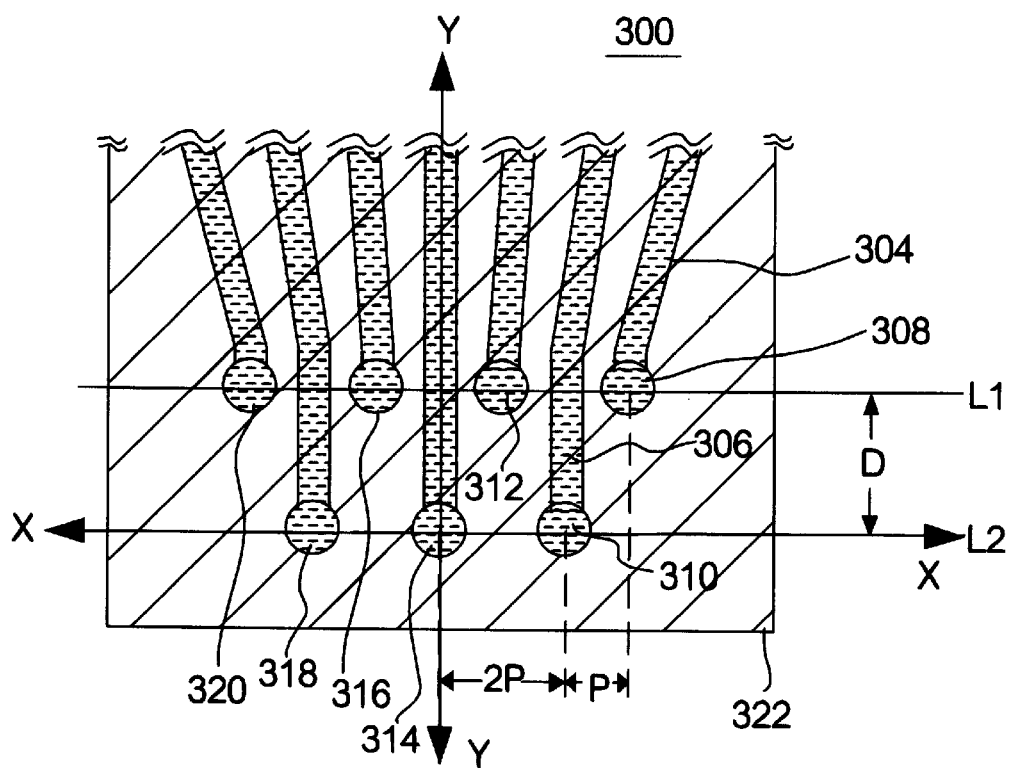
FIG. 3A illustrates an electrode layout diagram of a substrate according to a first preferred embodiment of the present invention.
Figure 3B:
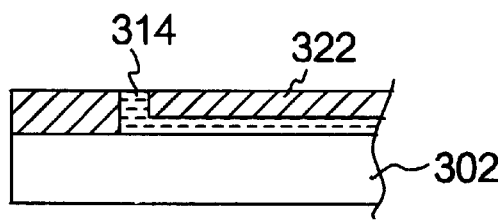
FIG. 3B shows a cross-sectional view of FIG. 3A along the Y—Y line.
Figure 3C:
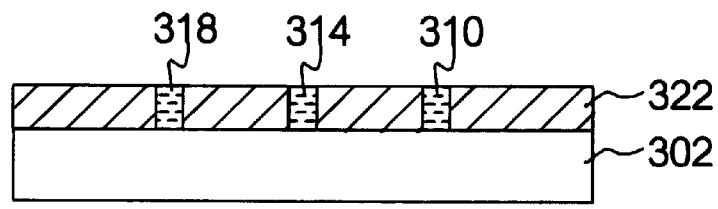
FIG. 3C shows a cross-sectional view of FIG. 3A along the X—X line.

Referring to FIG. 3A–3C, FIG. 3A illustrates a layout diagram of the electrode bonding structure according to the first preferred embodiment of the invention, FIG. 3B shows a cross-sectional view of FIG. 3A along the Y—Y line, and FIG. 3C shows a cross-sectional view of FIG. 3A along the X—X line. The electrode bonding structure includes a display substrate 300, a circuit board, and an anisotropic conductive film (ACF). The circuit board is a flexible printed circuit (FPC) board (not shown). The display substrate 300 includes a glass substrate 302, a first signal transmission device formed on the glass substrate 302, and a dielectric layer 322 formed on the glass substrate 302, and over the first signal transmission device. The first signal transmission device has several electrodes, including the first, the second, and the third substrate connecting electrode, and all electrode has a first width. The first and the third substrate connecting electrodes are short electrodes 304 and the second substrate connecting electrode is a long electrode 306. A pad is formed at the end of the each electrode, and each pad has a second width. Referring to FIG. 3A, the first pad 308 and the third pad 312 are at the end of the short electrodes 304 while the second pad 310 is at the end of the long electrode 306.

In the invention, the width of these pads is larger than that of the substrate connecting electrode, so the second width is wider than the first width. The short electrode and the long electrode are interlaced formed on the substrate 302. The first and the third pads are aligned to a first horizontal line and the second pad is aligned to a second horizontal line. A first pitch is defined between these lines. For example, the pitch P between the pad 308 and pad 310 along X-axis is 300 $\mu$m while the pitch D between the pad 308 and pad 310 along Y-axis is 1000 $\mu$m.

The lengths of the electrodes along Y-axis are different, so the pads are aligned to N different lines. Referring to FIG. 3A, take N is 2 as an example, two horizontal lines L1 and L2 are defined along X-axis and have a gap D. These neighboring pads are placed on two different lines. For example, the first pad 308, the third pad 314, and the fifth pad 318 are aligned to line L1; the second pad 310, the third pad 312, and the fourth pad 314 are aligned to line L2. The interlaced electrodes have a larger pitch between the neighboring electrodes. As shown in FIG. 3A, the pitch between the second pad 310 and the forth pad 314 is 2P $\mu$m, which is twice the distance of the conventional one. As the pitch is enlarged, the effect of the silver ion $Ag^+$ migration is reduced.

The pads in FIG. 3B and FIG. 3C are flat pads, and the height of the pad 310, 314, and 318 are the same as that of the dielectric layer 322. The dielectric layer covers the electrodes except the connecting pads. The silver ion $Ag^+$ migration effect can be reduced because the dielectric layer is formed between these electrodes. By using the interlaced electrodes and the dielectric layer, the $Ag^+$ migration effect and lower the chances of short circuits are both reduced.

Figure 4A:
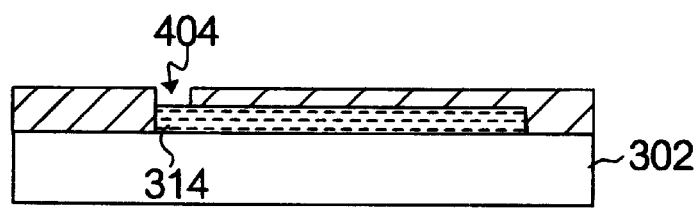
FIG. 4A illustrates the cross-sectional view of FIG. 3A along the Y—Y direction when the indenting pads are used.
Figure 4B:
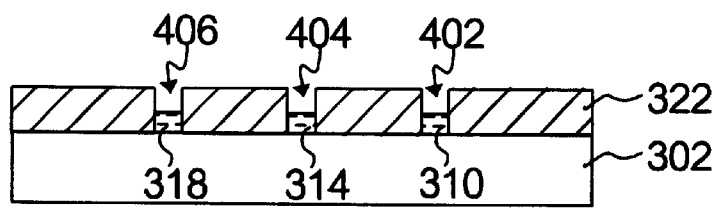
FIG. 4B illustrates the cross-sectional view of FIG. 3A along the X—X direction when the indenting pads are used.

Further, the pads in FIG. 4A and FIG. 4B are indenting pads. The FIG. 4A is the cross-sectional view of the electrodes along the Y—Y direction, and the FIG. 4B is the cross-sectional view of the electrodes FIG. 3A along the X—X direction. The display substrate includes the glass substrate 302 and the first signal transmission device. The structure of the first signal transmission device is the same as the one described above, and will not be repeated again. The inner surfaces of the indenting pads 310, 314 and 318 are lower than the surface of the substrate dielectric layer 322 so the holes 402, 404 and 406 are formed on the substrate dielectric layer 322.

Figure 5A:
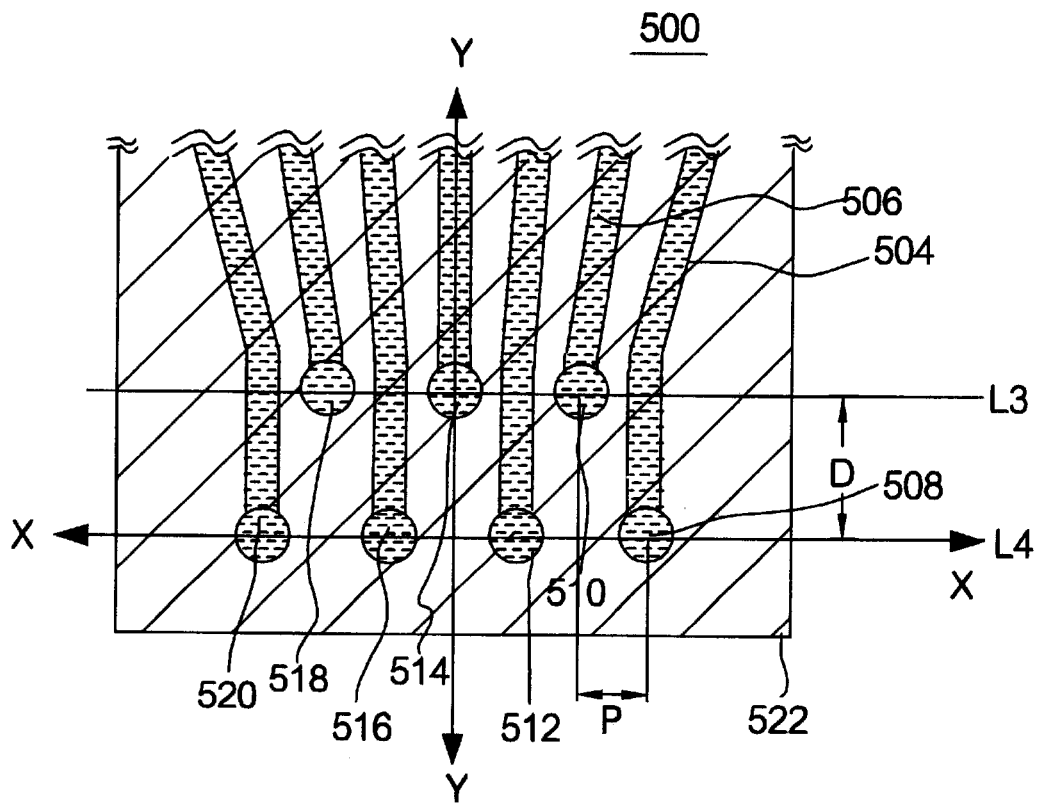
FIG. 5A illustrates an electrode layout diagram of the circuit board in the first preferred embodiment.
Figure 5B:
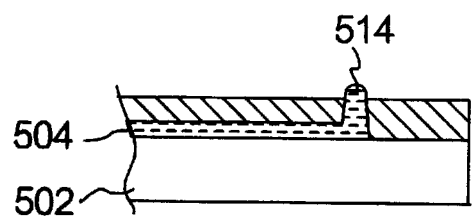
FIG. 5B illustrates the cross-sectional view from FIG. 5A along the Y—Y direction when the bump pads are used.
Figure 5C:
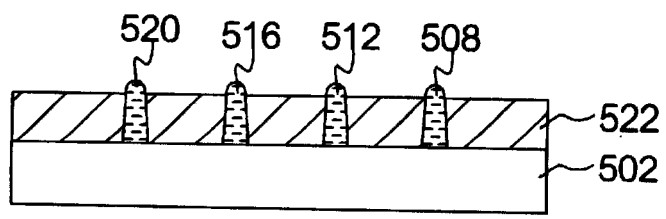
FIG. 5C illustrates the cross-sectional view of FIG. 5A along the X—X direction when bump pads are used.

Referring to FIG. 5A, FIG. 5B, and FIG. 5C, the pads are bump pads. FIG. 5A illustrates a layout diagram of the flexible printed circuit board in the preferred embodiment, FIG. 5B illustrates the cross-sectional view of FIG. 5A along the Y—Y direction, and FIG. 5C illustrates the cross-sectional view of FIG. 5A along the X—X direction. The thickness of the bump pads on the FPC board 500 is larger than that of the circuit dielectric layer 522 so the bump pads (e.g. pads 508, 510, 514 and 518) are protruded from the surface of the circuit dielectric layer 522.

In order to tightly connecting the substrate 302 and the FPC board 500, the position of the pads on the FPC board 500 (the bump pads) are corresponded to that of the pads on the substrate 302 (the indenting pads). The FPC board 500 includes a polyimide layer 202 and a second signal transmission device. The second signal transmission device includes multiple electrodes, such as the first, second, and third FPC board connecting electrodes, and all electrode has a third width. The first and third FPC connecting electrodes are long electrodes 504 while the second FPC connecting electrode is a short electrode 506. These electrodes are placed on the polyimide layer 502 in an interlaced arrangement.

At the end of each electrode is a bump pad with a fourth width. For example, the bump pads 508 and 512 are formed at the end of the long electrodes, and the bump pad 510 is formed at the end of the short electrode. Besides, the fourth width of the bump pads is larger than the third width of the FPC connecting electrodes. The pads are aligned to different lines because the lengths of the electrodes along Y-axis are different. The first bump pad 508, the third bump pad 512, the fifth bump pad 516, and the seventh bump pad 520 are aligned to the third horizontal line L3 while the second bump pad 510, the fourth bonding pad 514, and the sixth bonding pad 518 are aligned to the forth horizontal line L4. A second pitch is formed between the third horizontal line L3 and the fourth horizontal line L4. For example, the pitch between the neighboring pads 508 and 510 along X-axis and Y-axis are P m (e.g. 300 μm) and D m (e.g. 1000 μm).

Figure 6A:
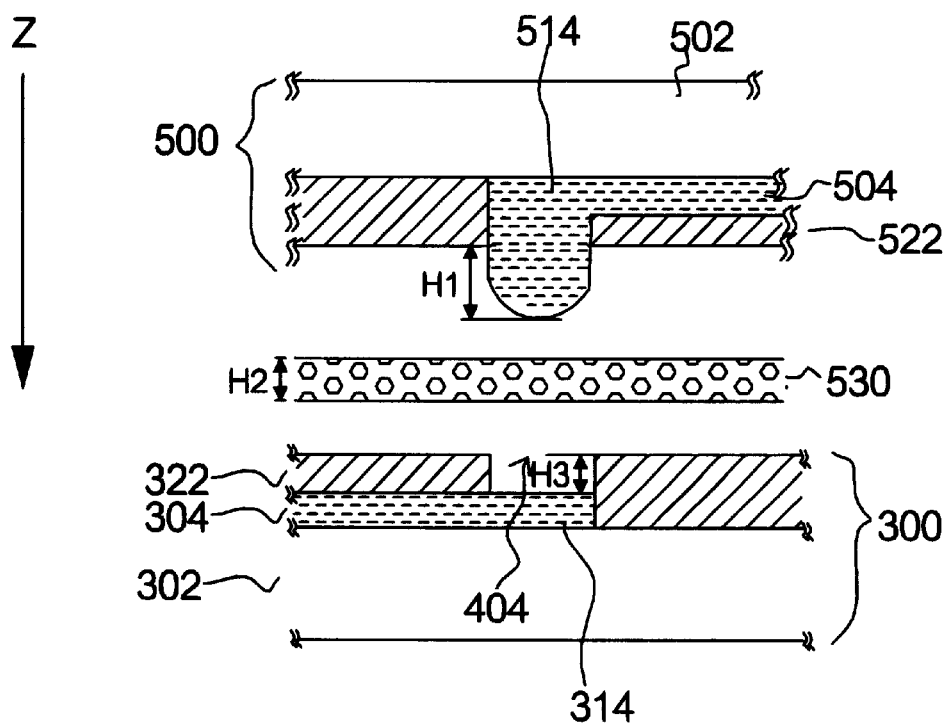
FIG. 6A illustrates the cross-sectional view along the Y—Y direction before the the substrate having the indenting pads and the circuit board having the bump pads are bonded.
Figure 6B:
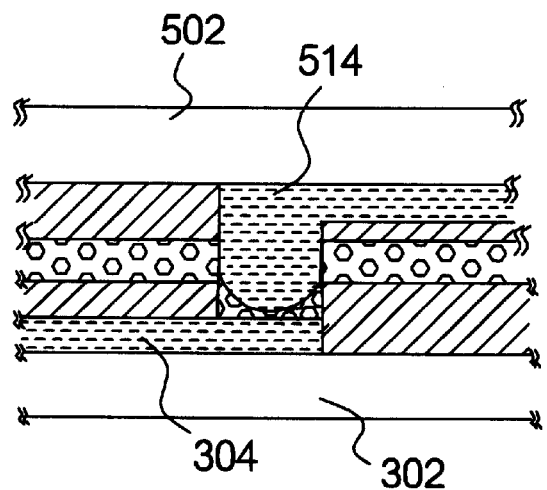
FIG. 6B illustrates the cross-sectional view along the Y—Y direction after the bonding of the substrate having indenting pads and the circuit board having bump pads.

Referring to FIG. 6A, it illustrates the cross-sectional view along the Y—Y direction before the substrate 300 having the indenting pads and the FPC board 500 having the bump pads are bonded. Before bonding, the bump pads 314 of the FPC board 500 and the indenting pads of the substrate 300 must be aligned, and the anisotropic conduct film (ACF) 530 is placed between upon the surface of the substrate 300 or the surface of the FPC board 500, wherein the surface of the substrate 300 and the surface of the FPC board 500 face to each other. Referring to FIG. 6B, the height H1 of the bump pads 514 is greater than or equal to the sum of the depth H3 of the indenting pads and the thickness H2 of ACF (H1>=H2+H3). Therefore, the ACF 530 above the bump pads 514 is squeezed after bonding to electrically connect the substrate 300 and the FPC board 500. After the bonding process, the other parts of the ACF 530 can either be squeezed to connect the FPC board and the substrate (when H1=H2+H3) or not be squeezed to keep them untouched (when H1>H2+H3). After bonding, the bump pads 514 can insert into in the hole 404 of the indenting pads 314 so the substrate 300 can be connected to the FPC tightly. In this preferred embodiment, the height H1 of the bump pad is greater than the sum of the depth H3 and the thickness H2 in order to avoid squeezing the whole ACF 530, such that the force of Z-axis will be applied mostly on the bump pads 514 when the substrate 300, the ACF 530, and the FPC board 500 are bonded together.

Figure 2:
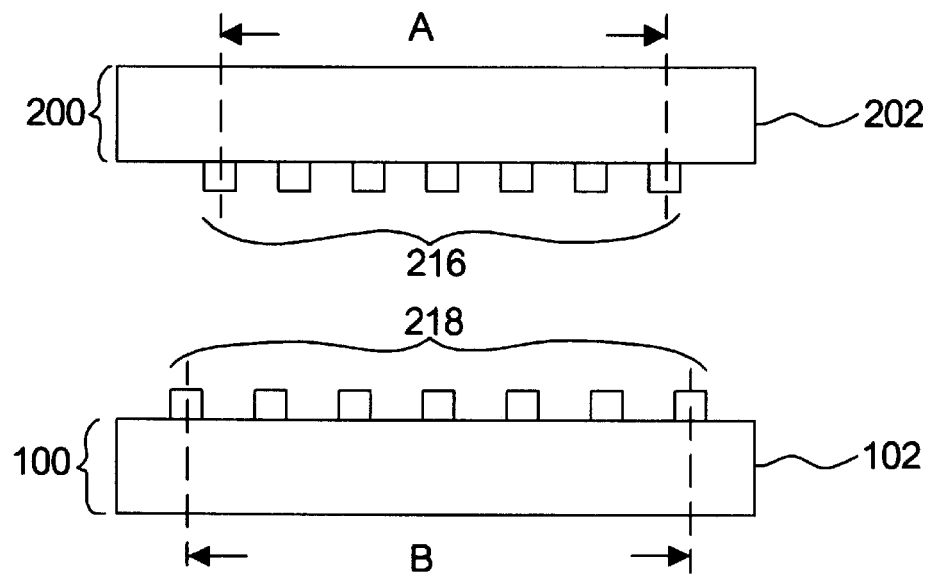
FIG. 2 is the cross-sectional view showing the structure of the unbounded substrate and the circuit board.

The thermal compensation coefficients of all material should be considered to make sure that the substrate can be aligned to the FPC board, therefore, the design of the conventional FPC board (shown in FIG. 2) is complicated. In the present invention, the indenting pads and the bump pads make the alignment easier and reduce the thermal expansion of the polyimide layer 502.

In FIG. 6A, a thermal expansion of the FPC board 500 is occurred and the bump pads 514 are expanded during the bonding process. In the same time, the bump pad 514 is embedded into the hole 404 and the thermal expansion may be reduced. Therefore, the hole 404 on the substrate 300 will reduce the thermal expansion of the FPC board 500.

Figure 7A:
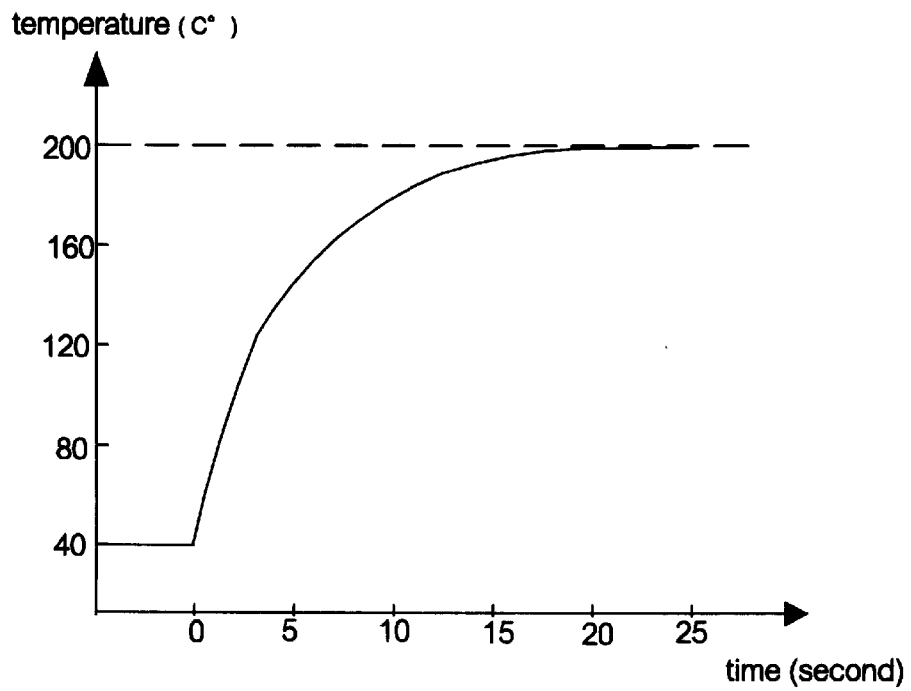
FIG. 7A is a time vs. temperature diagram during the bonding process.
Figure 7B:
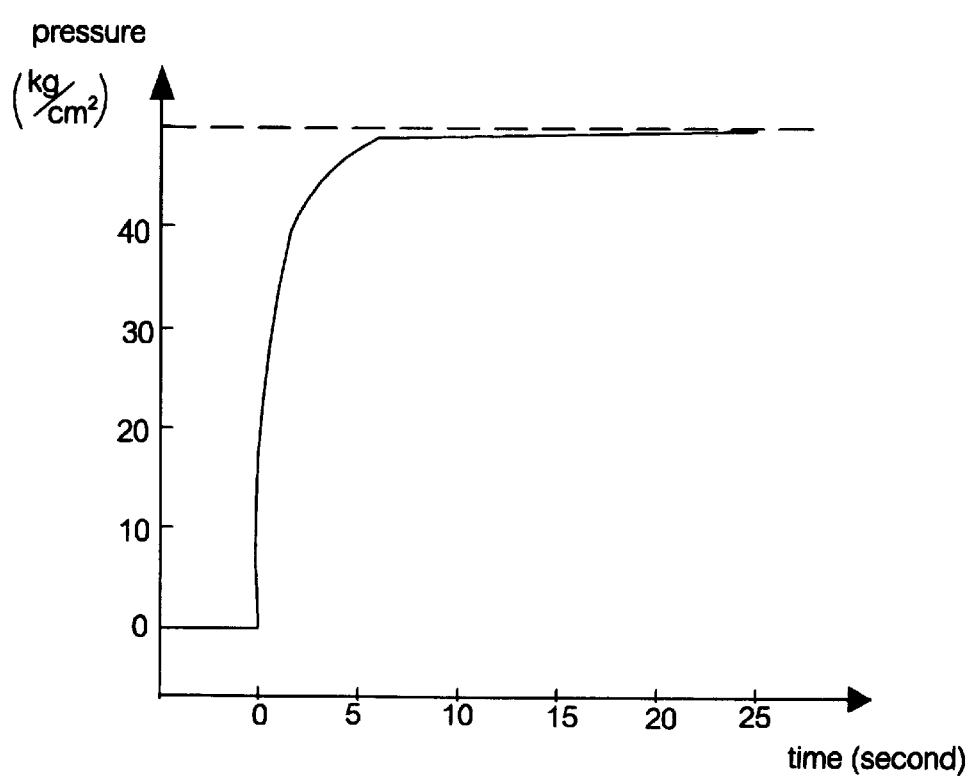
FIG. 7B is a time vs. pressure diagram during the bonding process.

Referring to FIG. 7A and FIG. 7B, FIG. 7A is a time vs. temperature diagram during the bonding process, and FIG. 7B is a time vs. pressure diagram during the bonding process. In FIG. 7A and FIG. 7B, the change rate of pressure is larger that that of temperature during the thermal compressed bonding process. For example, the pressure on the FPC board and the substrate along the z direction is increased from 0 to 50 kg/cm$^2$ within 5 seconds; however, it needs about 20 seconds to increase the temperature from 20 to 200 in order to reach the stable status of the bonding process. In other words, after the bump pads 514 are tightly connected with the indenting pads 314, the temperature is rise high enough to cause the thermal expansion. Therefore, the force between the indenting and bump pads can suppress the thermal expansion of the FPC board 500, and the design of the FPC board 500 is more easily since there is no need to consider the thermal expansion effect of all materials.

The method for manufacturing the electrode bonding structure shown in FIG. 6A–6B includes several steps. First, forming an indenting pad then forming a substrate dielectric layer on a surface of a substrate. The inner surface of the indenting pad is lower than the substrate dielectric layer by a depth H3. Second, forming a circuit dielectric layer and a bump pad on a surface of a FPC board, and the bump pad is higher than the circuit dielectric layer by a height H1. Then, positioning an anisotropic conductive film (ACF) between the substrate and the circuit board. The ACF has a thickness H2, and the height H1 is not less than the sum of the thickness H2 and the depth H3 (H1>=H2+H3). Finally, bonding the substrate, the ACF, and the circuit board together such that the ACF above the bump pad is squeezed for electrically connecting the substrate and the circuit board, and the bump pad is inserted into the indenting pad for reducing a thermal expansion of the circuit board caused during the bonding process.

The detail steps are described below. Referring to FIG. 6A, the short electrodes 304 and the long electrodes 306 are first formed on the glass substrate 302 extended along Y-axis. Second, the ends of the electrodes are aligned to different lines so the electrodes are arranged in an interlaced form. For example, the pads 308 and 310 with a wider width are formed at the ends of the electrodes. A substrate dielectric layer 322 covers the substrate 302 and the electrodes, but a part of the dielectric layer is removed to expose the pads.

The electrodes on the substrate 300 can be formed by a screen printing process or a sputter process. The dielectric layer 322, 522 can be formed by a screen printing process to print the patterned electrodes or cover the substrate 300 with the dielectric layer then use photolithography process to define the pattern of the electrodes. The bump pads can be made by the conventional method for making bumps on the FPC board.

Figure 8A:
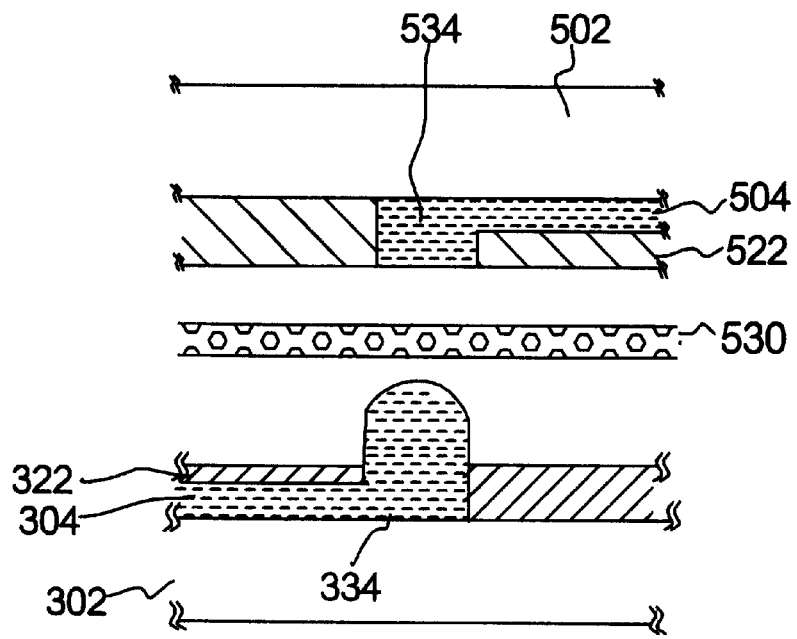
FIG. 8A illustrates the cross-sectional view before the bonding of the circuit board having flat pads and the substrate having bump pads.
Figure 8B:
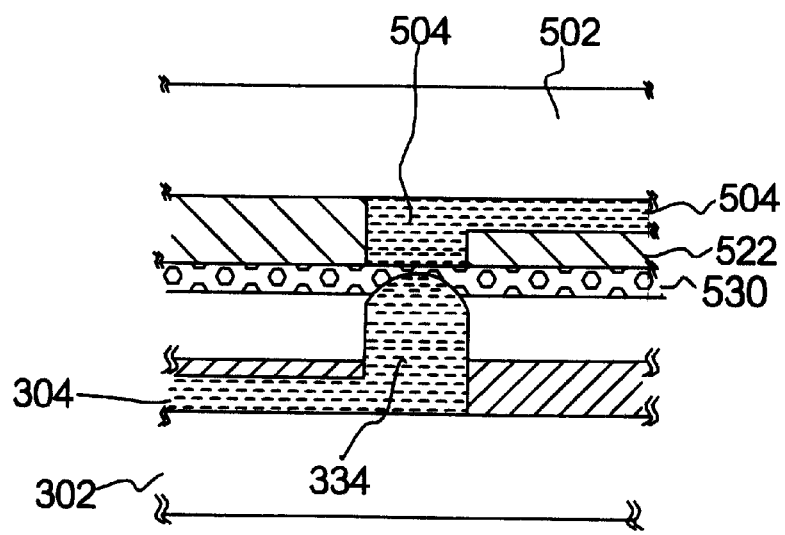
FIG. 8B illustrates the cross-sectional view after the bonding of the circuit board having flat pads and the substrate having bump pads.
Figure 8C:
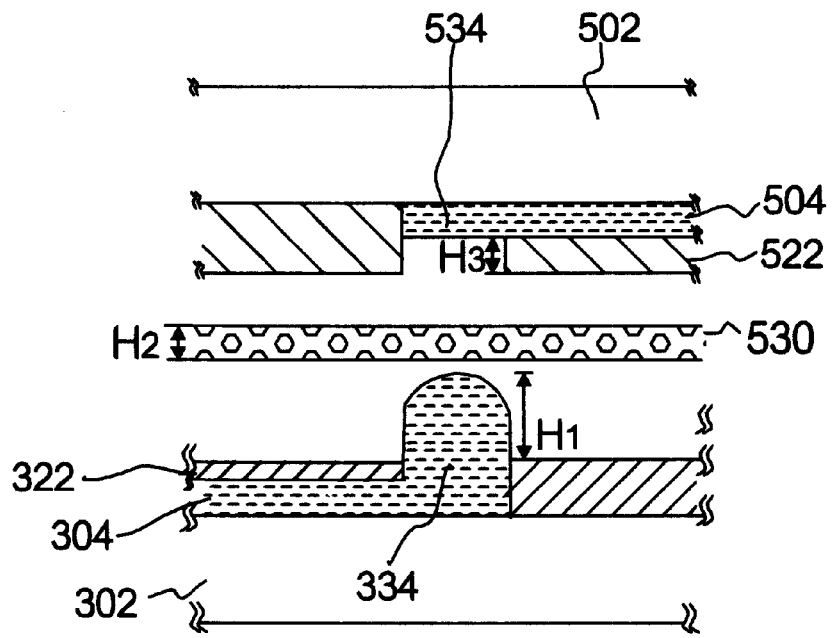
FIG. 8C illustrates the cross-sectional view before the bonding of the circuit board having indenting pads and the substrate having bump pads.
Figure 8D:
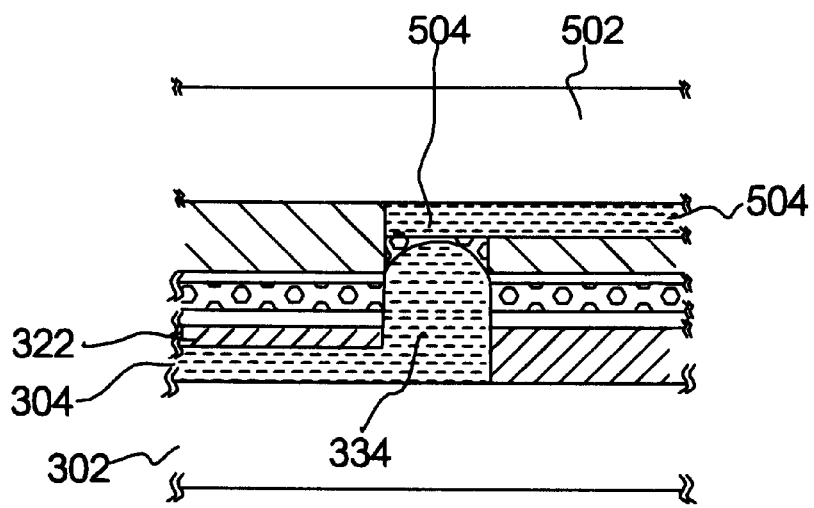
FIG. 8D illustrates the cross-sectional view after the bonding of the circuit board having indenting pads and the substrate having bump pads.

Referring to FIG. 8A to 8D, they illustrate the second preferred embodiment of this invention. FIG. 8A and FIG. 8B are the cross-sectional views before and after the bonding of the FPC board having the flat pads 534 and the substrate having the bump pads 334. FIG. 8C and 8D are the cross-sectional views before and after the bonding of the FPC board having the indenting pads 534 and the substrate having the bump pads 334. The anisotropic conduct film ACF 530 is placed upon the surface of the substrate 300 or the surface of the FPC board 500, wherein the surface of the substrate 300 and the surface of the FPC board 500 face to each other. Referring to FIG. 8B and 8D, the height H1 of the bump pads 334 is greater than or equal to the sum of the depth H3 of the indenting pads 534 and the thickness H2 of the ACF 530 (H1>=H2+H3). During the bonding process, the ACF 530 above the bump pads 514 will be squeezed to electrically connect the substrate 300 and the FPC 500.

Figure 1A:
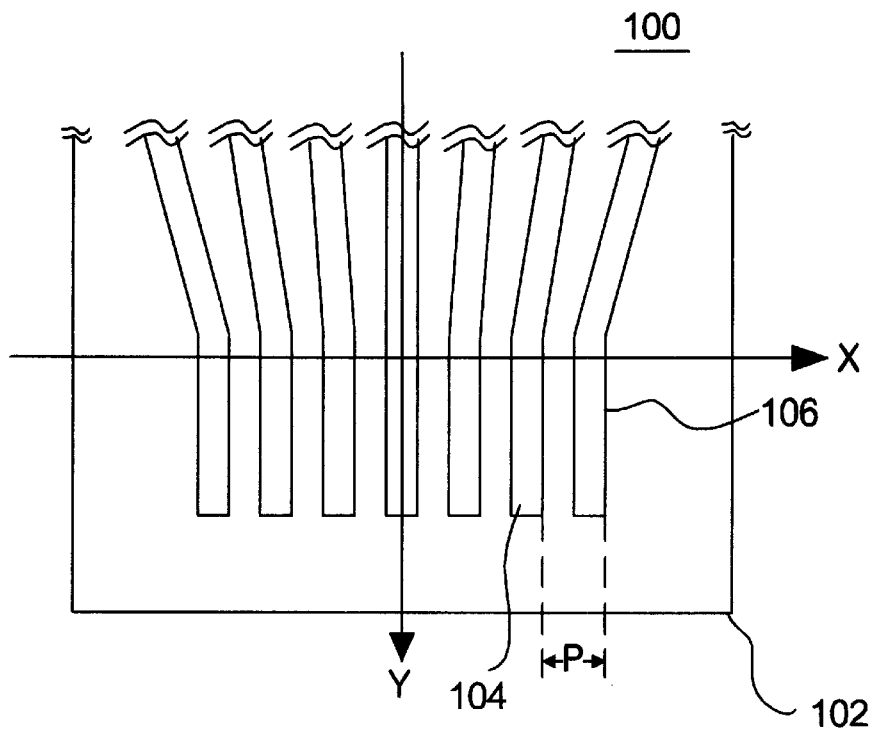
FIG. 1A is a layout of electrodes used in a conventional flat display.
Figure 1B:
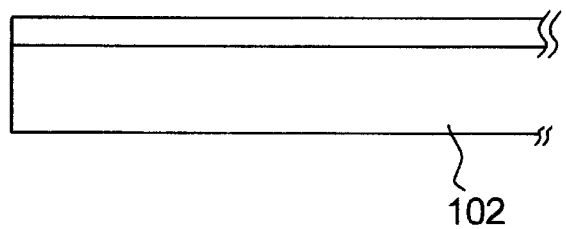
FIG. 1B is a cross-sectional view of FIG. 1A along the Y direction.
Figure 1C:
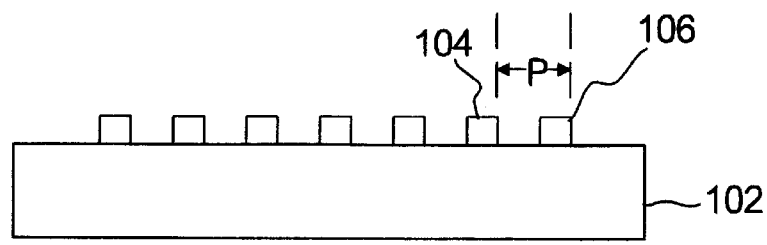
FIG. 1C is a cross-sectional view of FIG. 1A along the X direction.
Figure 9:
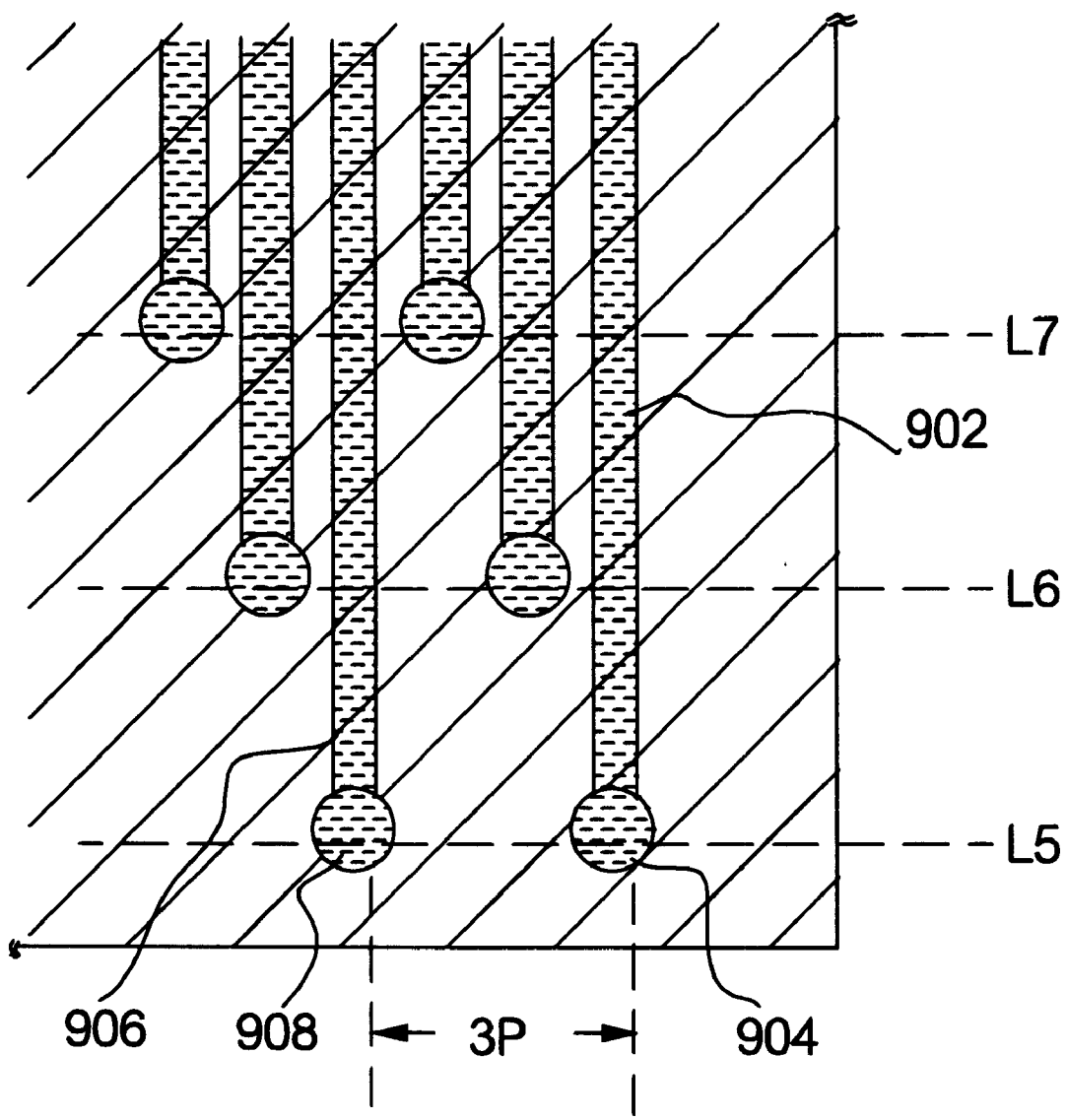
FIG. 9 illustrates an electrode layout diagram of a second preferred embodiment of the present invention.

Referring to FIG. 9, it is an electrode layout when these electrodes are divided into 3 groups. In FIG. 9, the pads of the electrodes are aligned to 3 different horizontal lines L5, L6, and L7. Thus, the pitch between the neighboring pads is increased to triple as compared to the conventional one (FIG. 1). For example, the pitch between the pads 904 of the electrodes 902 and the pads 908 of the electrodes 906 is 3P.

The electrode bonding structure used in the flat display described above can reduce the silver ion $Ag^+$ migration effect by:

1. enlarging the end of the electrodes to form pads;
2. covering the electrodes with a dielectric layer.

The ends of the electrodes are enlarged so the accuracy required for the alignment of the substrate and the FPC board is decreased. The pads of the substrate and the FPC can either be bump pads or indenting pads. The design of the FPC board is less complex and improves the quality of the display.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrode bonding structure, comprising:

a substrate having a substrate dielectric layer and an indenting pad on one surface of the substrate, the substrate dielectric layer having a hole exposing an inner surface of the indenting pad, the inner surface of the indenting pad being lower than the surface of the dielectric layer by a depth H3;

a circuit board having a circuit dielectric layer and a bump pad on one surface of the circuit board, the bump pad protruding through and being higher than the circuit dielectric layer by a height H1; and an anisotropic conductive film (ACF) placed upon one of the one surface of the substrate and the one surface of the circuit board, the ACF having a thickness H2;

wherein the circuit board is positioned parallel to the substrate such that the one surface of the circuit board faces the one surface of the substrate and the ACF is disposed between them, and wherein the position of the indenting pad corresponds to the position of the bump pad, the height H1 is equal to or greater than the sum of the thickness H2 and the depth H3 (H1>=H2+H3) such that the ACF above the bump pad is squeezed after the substrate and the circuit board are bonded for electrically connecting the substrate and the circuit board, and the bump pad is positioned into the hole exposing the indenting pad for reducing a thermal expansion of the circuit board caused during the process for bonding the substrate and the circuit board.

2. An electrode bonding structures comprising:

a substrate having a substrate dielectric layer and a bump pad on one surface of the substrate, the bump pad protruding through and being higher than the substrate dielectric layer by a height H1;

a circuit board having a circuit dielectric layer and an indenting pad on one surface of the circuit board, the circuit dielectric layer having a hole exposing an inner surface of the indenting pad, the inner surface of the indenting pad being lower than the circuit dielectric layer by a depth H3; and an anisotropic conductive film (ACF) placed upon one of the one surface of the substrate and the one surface of the circuit board, the ACF having a thickness H2;

wherein the circuit board is positioned parallel to the substrate such that the one surface of the circuit board faces the one surface of the substrate and the ACF is disposed between them, and wherein the position of the indenting pad corresponds to the position of the bump pad, the height H1 is equal to or greater than the sum of the thickness H2 and the depth H3 (H1>=H2+H3) such that the ACF above the bump pad is squeezed after the substrate and the circuit board are bonded for electrically connecting the substrate and the circuit board, and the bump pad is positioned into the hole exposing the indenting pad for reducing a thermal expansion of the circuit board caused during the process for bonding the substrate and the circuit board.

3. A method for manufacturing an electrode bonding structure of a flat display panel, comprising the steps of:

forming an indenting pad on one surface of a substrate;

forming a substrate dielectric layer on the one surface of the substrate, the substrate dielectric layer having a hole exposing an inner surface of the indenting pad, the inner surface of the indenting pad being lower than the substrate dielectric layer by a depth H3;

forming a bump pad on one surface of a circuit board;

forming a circuit dielectric layer on the one surface of the circuit board, the bump pad protruding through and being higher than the circuit dielectric layer by a height H1;

placing an anisotropic conductive film(ACF) upon one of the one surface of the substrate and the one surface of the circuit board, the ACF having a thickness H2, and the height H1 being equal to or greater than the sum of the thickness H2 and the depth H3 (H1>=H2+H3); and bonding the substrate, the ACF, and the circuit board together such that the ACF above the bump pad is squeezed for electrically connecting the substrate and the circuit board, and the bump pad is positioned into the hole exposing the indenting pad for reducing a thermal expansion of the circuit board caused during the bonding process.

4. A method for manufacturing an electrode bonding structure of a flat display panel, comprising the steps of:

forming a bump pad on one surface of a substrate;

forming a substrate dielectric layer on the one surface of the substrate, the bump pad protruding through and being higher than the substrate dielectric layer by a height H1;

forming an indenting pad on one surface of a circuit;

forming a circuit dielectric layer on the one surface of the circuit, the circuit dielectric layer having a hole exposing an inner surface of the indenting pad, the inner surface of the indenting pad being lower than the circuit dielectric layer by a depth H3;

placing an anisotropic conductive film (ACF) upon one of the one surface of the substrate and the one surface of the circuit board, the ACF having a thickness H2, and the height H1 being equal to or greater than the sum of the thickness H2 and the depth H3 (H1>=H2+H3); and bonding the substrate, the ACF, and the circuit board together such that the ACF above the bump pad is squeezed for electrically connecting the substrate and the circuit board, and the bump pad is positioned into the hole exposing the indenting pad for reducing a thermal expansion of the circuit board caused during the bonding process.

5. An electrode bonding structure, comprising:

a substrate having a substrate dielectric layer and a first signal transmission device on one surface of the substrate, the first signal transmission device including a plurality of indenting pads, the substrate dielectric layer having a plurality of holes, each of the plurality of holes exposing an inner surface of a corresponding one of the plurality of indenting pads, the inner surface of each of the plurality of indenting pads being lower than the substrate dielectric layer by a depth H3;

a circuit board having a circuit dielectric layer and a second signal transmission device on one surface of the circuit board, the second signal transmission device including a plurality of bump pads, each of the plurality of bump pads protruding through and being higher than the circuit dielectric layer by a height H1; and an anisotropic conductive film (ACF) placed upon one of the one surface of the substrate and the one surface of the circuit board, the ACF having a thickness H2;

wherein the circuit board is positioned parallel to the substrate such that the one surface of the circuit board faces the one surface of the substrate and the ACF is disposed between them, and wherein the position of each of the plurality of indenting pads corresponds to the position of a corresponding one of the plurality of bump pads, the height H1 is equal to or greater than the sum of the thickness H2 and the depth H3 (H1>=H2+H3) such that the ACF above each of the plurality of bump pads is squeezed after the substrate and the circuit board are bonded for electrically connecting the substrate and the circuit board, and each of the plurality of bump pads is positioned into the hole exposing the corresponding one of the plurality of indenting pads for reducing a thermal expansion of the circuit board caused during the process for bonding the substrate and the circuit board.

6. The electrode bonding structure according to claim 5, wherein the first signal transmission device comprises:

a first, a second, and a third substrate bonding electrode, each electrode having a first width; and a first, a second and a third indenting pad respectively positioned at one end of the first, the second and the third substrate bonding electrode, each indenting pad having a second width, and the second width being larger than the first width;

wherein the first and the third indenting pad is aligned to a first horizontal line, the second indenting pad is aligned to a second horizontal line, and a first pitch is defined between the first and the second horizontal line.

7. The electrode bonding structure according to claim 5, wherein the second signal transmission device comprises:

a first, a second, and a third circuit bonding electrode, each electrode having a third width; and a first, a second, and a third bump pad respectively positioned at one end of the first, the second, and the third circuit bonding electrode, each pad having a fourth width, and the fourth width being lager than the third width;

wherein the first and the third bump pad is aligned to a third horizontal line, the second bump pad is aligned to a fourth horizontal line, and a second pitch is defined between the third and the fourth horizontal line.

* * * * *